United States Patent [19]

Kitayama et al.

[11] Patent Number: 5,646,439
[45] Date of Patent: Jul. 8, 1997

[54] ELECTRONIC CHIP COMPONENT WITH PASSIVATION FILM AND ORGANIC PROTECTIVE FILM

[75] Inventors: Yoshifumi Kitayama, Hirakata; Kazuhiro Mori, Katano; Keiji Saeki, Kobe; Takashi Akiguchi, Osaka, all of Japan

[73] Assignee: Matsushita Electric Industrial Co., Ltd., Kadoma, Japan

[21] Appl. No.: 703,876

[22] Filed: Aug. 27, 1996

Related U.S. Application Data

[63] Continuation of Ser. No. 193,359, Feb. 3, 1994, abandoned, which is a continuation of Ser. No. 882,131, May 13, 1992, abandoned.

[51] Int. Cl.$^6$ ............................................. H01L 23/58
[52] U.S. Cl. ........................... 257/632; 257/642; 257/643; 257/649
[58] Field of Search ........................... 257/637, 792, 257/692, 643, 642, 649

[56] References Cited

U.S. PATENT DOCUMENTS

| | | | |
|---|---|---|---|
| 4,523,372 | 6/1985 | Balda et al. | 257/643 |
| 4,652,598 | 3/1987 | Edelman | 257/792 |
| 4,901,133 | 2/1990 | Curran et al. | 257/637 |
| 4,907,064 | 3/1990 | Yamazaki et al. | 257/649 |
| 4,913,930 | 4/1990 | Getson | 206/330 |
| 4,963,405 | 10/1990 | Yamashita et al. | 206/328 |

*Primary Examiner*—Sara W. Crane
*Assistant Examiner*—Roy Potter
*Attorney, Agent, or Firm*—Wenderoth, Lind & Ponack

[57] ABSTRACT

An electronic chip component includes an electrode formed on a wafer, a passivation film formed on the wafer, and an organic protective film covering an entire surface of exposed portions of the electrode and the passivation film. A package for packing the component includes a carrier tape having therethrough a space for receiving the component with one end or side of the space opened, and a cover tape for closing the open end of the space after the component is stored in the space. A method for packing the component includes the steps of storing the component in the space of the carrier tape with one end of the space opened, and closing the open end of the space with the cover tape.

4 Claims, 4 Drawing Sheets

ELECTRONIC CHIP COMPONENT WITH PASSIVATION FILM AND ORGANIC PROTECTIVE FILM

This is a continuation of application Ser. No. 08/193,359, filed Feb. 3, 1994, now abandoned, which is a continuation of application Ser. No. 07/882,131, filed May 13, 1992, now abandoned.

BACKGROUND OF THE INVENTION

The present invention relates to an electronic chip component and a package for packing the electronic chip component by means of tape.

A conventional method for packing an electronic chip component by means of a tape is described below with reference to FIG. 8. A wafer is divided into a plurality of electronic chip components by dicing it. Each component 41 is stored in a respective hole 45 of a carrier tape main body 42 to which a bottom tape 43 is attached. A top tape 44 then is affixed to the carrier tape main body 42 so as to seal the bottom of hole 45. Electronic chip component 41 has an active surface 46 having an electrode 47 formed thereon. The wafer and chip are covered with a passivation film 48 made of silicon dioxide or silicon nitride, except for a portion or portions 47 of the chip component to be attached to external electrodes. The passivation film 48 imparts a moisture resistance to the electronic chip component 41.

A disadvantage of such conventional arrangement is that the active surface 46 of the electronic chip component 41 is partially exposed to the air. Further, the active surface 46 may be damaged or chipped when the electronic chip component 41 contacts the inner surface of the top tape 44 or the inner surface of the hole 45 as a result of movement of the electronic chip component 41 in the hole 45 after the electronic chip component 41 is taped. Since the electrode portion 47 is in contact with the air, portion 47 becomes oxidized which causes corrosion.

Moreover, pin holes may be formed in the passivation film 48. Accordingly, the resistance of the electronic chip component 41 to moisture may be insufficient.

SUMMARY OF THE PRESENT INVENTION

It is an object of the present invention to provide an electronic chip component which prevents an active surface thereof from being damaged or chipped, an electrode portion thereof from being oxidized, or a pin hole from in a passivation film thereof from remaining exposed, and a package for packing such electronic chip component by means of tape.

In accomplishing this and other objects, according to one aspect of the present invention, there is provided an electronic chip component including an electrode formed on a wafer, a passivation film formed on the wafer, and an organic protective film covering entire surfaces of exposed portions of the electrode and the passivation film.

According to another aspect of the present invention, there is provided a tape-type package for packing such electronic chip component. The package includes a carrier tape main body having therethrough a space for receiving and storing the component with one end of the space opened. A cover tape closes such opened end of the space after the component is stored therein.

According to a further aspect of the present invention, there is provided a method for packing such electronic chip component. The method includes the steps of inserting the component into the space in the carrier tape main body and one end of the space opened, and then closing the open end of the space with a cover tape.

According to the above features of the invention, even though the electronic chip component having the organic protective film formed on the active surface thereof and stored in the space of the carrier tape is moved in storing space, when the active surface collides with the cover tape, the organic protective film protects the active surface because of its cushioning function. The organic protective film also shields the active surface from the air. Therefore, the electrode disposed on the active surface can be prevented from being oxidized, and moisture can be prevented from permeating into the electronic chip component. Since the organic protective film is formed on the wafer, the electronic chip component can be produced at a high production efficiency. In addition, only a portion of the organic film is destroyed in a subsequent process of use of the chip component. Thus, a good electrical connection can be made. Since the organic protective film protects the active surface of the electronic chip component from the air, the electrode can be prevented from being oxidized. Since the organic protective film covers any pin holes in the passivation film, moisture is prevented from permeating into the electronic chip component through such pin holes. A part of the organic protective film corresponding to the part of the electrode to be connected to an external electrode is destroyed by pressing, e.g. a metal wire having a spherical leading end, with a bonding tool. Thereby, the metal wire can be bonded with the electrode of the electronic chip component under pressure. Accordingly, a metal bump easily can be formed on the electrode or the metal wire easily can be bonded with the electrode of the electronic chip component.

According to a further feature of the electronic chip component of the present invention, a metal bump may be formed on the wafer, and the all exposed surfaces of the passivation film, the electrode and the bump are covered with the organic protective film, and the wafer is diced into a plurality of electronic chip components. The organic protective film protects the surfaces of the wafer, the electrode and the metal bump against the air. Accordingly, the electrode can be prevented from being oxidized and moisture can be prevented from permeating into the electronic chip component. According to this embodiment of the electronic chip component of the present invention, a portion of the organic protective film corresponding only to a bonding portion between the metal bump and an external electrode easily can be destroyed by compressing such film portion to bond the external electrode to the metal bump. Further, even if the external electrode contacts an edge portion of the electronic chip component, the organic protective film prevents the generation of a short circuit due to its electrical insulating function.

BRIEF DESCRIPTION OF THE DRAWINGS

These and other objects and features of the present invention will become clear from the following description of preferred embodiments thereof with reference to the accompanying drawings, in which.

DETAILED DESCRIPTION OF THE INVENTION

Figure 1:
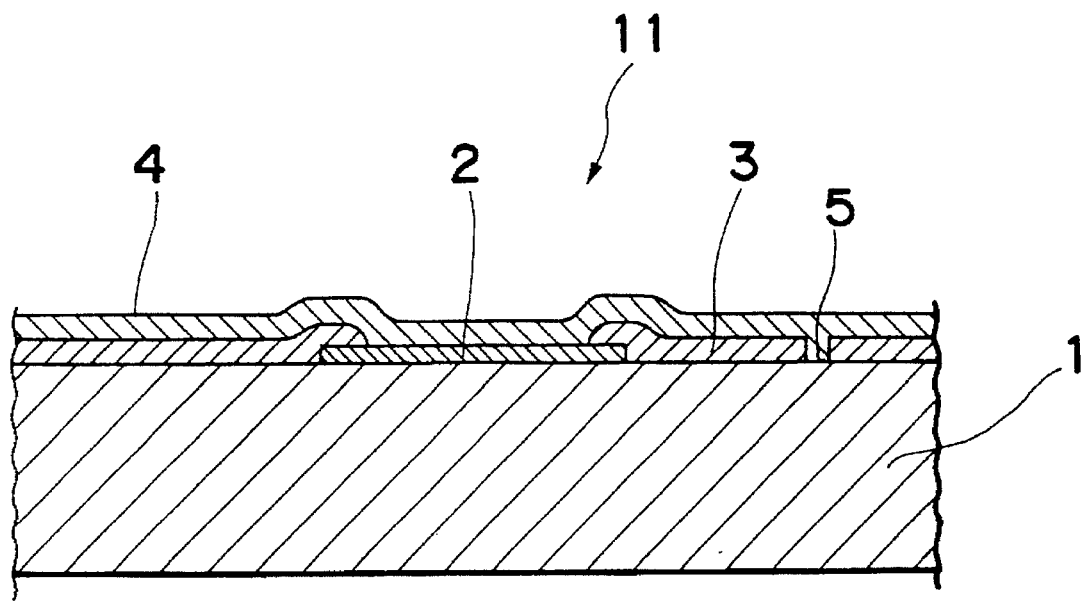
FIG. 1 is a sectional view of a portion of a wafer according to a first embodiment of the present invention.

Before the description of the present invention proceeds, it is to be noted that like parts are designated by like reference numerals throughout the accompanying drawings.

Figure 2:
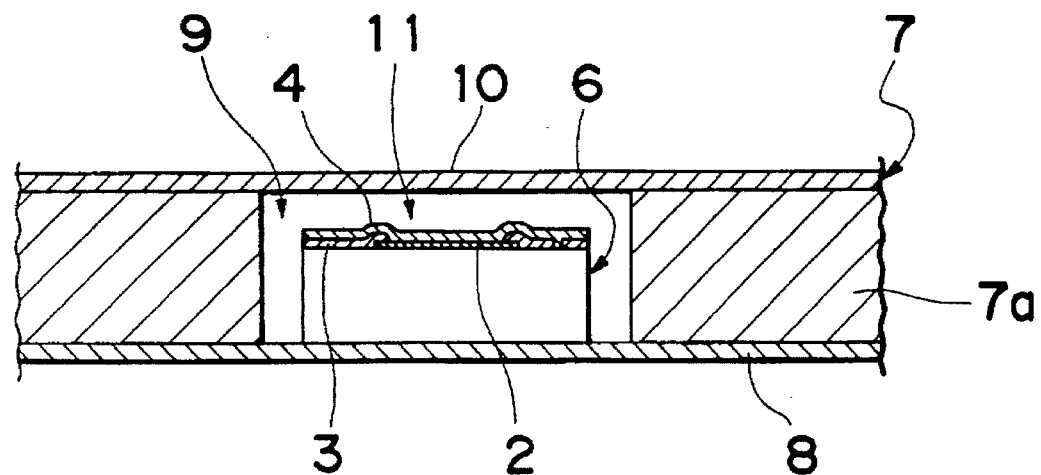
FIG. 2 is a sectional view showing a package packaging an electronic chip component formed from the structure of FIG. 1.

Referring to FIGS. 1 and 2, a first embodiment of the present invention is described below.

FIG. 1 shows a wafer 1 to be formed into plural electronic chip components. An aluminum electrode member 2 for each component to be formed (only one shown in FIG. 1) is formed on an active surface 11 of wafer 1. A center portion of the aluminum electrode 2, to connect the respective electronic chip component with an external electrode, is exposed to the air while the periphery of the aluminum electrode 2 in the horizontal direction thereof and the surface of the wafer i are covered with a passivation film 3, of a thickness of 0.8 to 1.3 µm, comprising silicon dioxide or silicon nitride so that the wafer 1 is resistant to moisture. That is, film 3 forms a moisture barrier. After the passivation film 3 is formed, the exposed portion of the aluminum electrode 2 and the passivation film 3 are covered with polyimide solution by means of spin coating so as to cover the surface of the wafer 1 with the polyimide solution of the same thickness. Then, the polyimide solution is heated for one to three hours at 100°–150° C. to harden the polyimide. As a result, an organic protective film 4 is formed on the surface of the exposed portion of the aluminum electrode 2 and the passivation film 3. A pin hole 5 may be formed in the passivation film 3, but the polyimide solution penetrates into the pin hole 5, thus filling pin hole 5. Therefore, an active surface 11 of the wafer i is entirely covered and protected from the air by the organic protective film 4. That is, film 4 forms an air barrier.

Instead of polyimide, depending on the particular electronic chip component, the organic protection film 4 may be made of a thermosetting organic substance or a thermoplastic organic substance such as polyurethane, polyphenylene sulfide or epoxy resin having high electrical insulation properties and applied by a suitable film forming method of under suitable conditions.

After the wafer i is covered with the organic protective film 4, the wafer i is diced into a plurality of electronic chip components 6. The outer surface of film 4 of each component 6 is entirely exposed and uncovered.

As shown in FIG. 2, a carrier tape 7 includes a bottom tape 8 made of polyester and adhered to a main body 7a consisting of polystyrene. An electronic chip component 6 is stored in a hole 9 formed through main body 7a, with tape 8 sealing the bottom of hole 9. Thereafter, a top tape 10 made of polyester is adhered to the carrier tape main body 7a so as to seal the top of hole 9. Thus, the electronic chip component 6 is packed in the carrier tape 7. The bottom tape 8 and the top tape 10 are formed of resin films. Not only polystyrene and polyester, but also a material having a resistivity value of $10^4 \Omega cm$ to $10^6 \Omega$ cm may be used as the carrier tape main body 7a.

Even if the electronic chip component 6, having the active surface 11 thereof covered with the organic protective film 4, stored in the hole 9 of the carrier tape 7 is moved in the hole 9 and contacts the inner surface of the top tape 10 or the inner surface of main body 7a defining hole 9, the active surface 11 of electronic chip component 6 is not damaged or chipped because the active surface 11 is protected by the organic protective film 4.

Since the organic protective film 4 protects the active surface 11 against the air, the aluminum electrode 2 can be prevented from being oxidized, and at the same time moisture can be prevented from permeating into the electronic chip component 6. That is, the electronic chip component 6 is resistant to oxidation and moisture.

The organic protective film 4 does not have a mechanical strength sufficient to withstand the heat and the pressure applied thereto when the electronic chip component 6 is bonded into a circuit board. Accordingly, the portion of the organic protective film 4 corresponding to the electrode 2 is destroyed when the electrode 2 is bonded with a metal wire of the circuit board. It is easy to destroy the portion of the organic protective film 4 necessary for bonding the metal wire with the electrode 2. Therefore, the organic protective film 4 is preferable for use in an electronic chip component which is bonded with a metal wire in a subsequent process.

According to the first embodiment, even though the active surface of the taped electronic chip component contacts an inner surface of the space accommodated within the carrier tape main body or an inner surface of the top tape, the active surface of the electronic chip component will be prevented from being damaged or chipped. In addition, the electronic chip component is resistant to oxidation and moisture. Thus, the electronic chip component is reliable and easily can be bonded with the metal wire.

Figure 3:
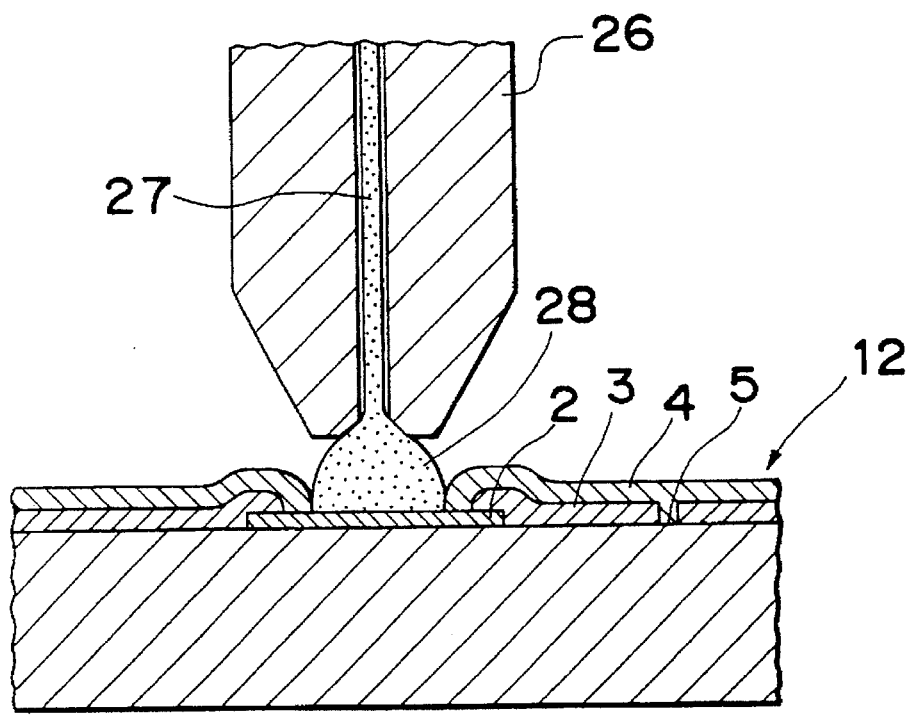
FIG. 3 is a partial sectional view showing a connection of a metal bump to such electronic chip component.
Figure 4:
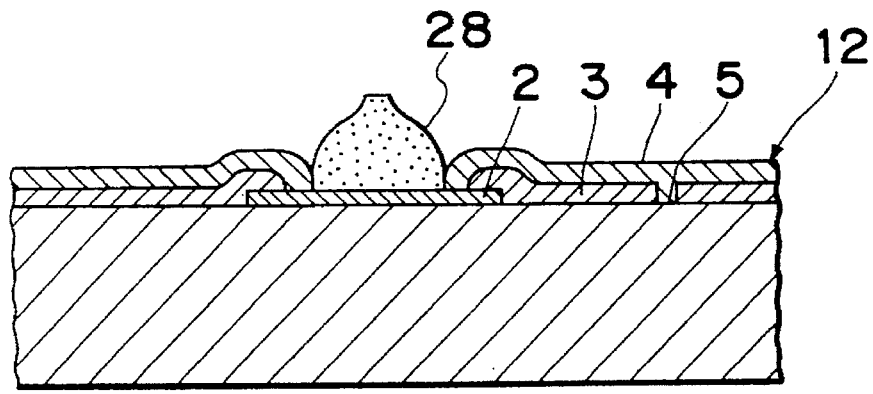
FIG. 4 is a partial sectional view showing the resultant metal bump formed on such electronic chip component.

FIGS. 3 and 4 show a process of connecting an external electrode in the form of a metal bump on an electronic chip component 12 formed by dicing the wafer i covered with the organic protective film 4 as described above. Referring to FIG. 3, a metal wire 27 having a ball 28 formed on the leading end thereof is disposed on the electronic chip component 12 by means of a capillary (bonding tool) 26 while the wire 27 is held by the bonding tool 26. Then, the capillary 26 is moved downward to press the organic protective film 4, and the organic protective film 4 is heated at 400° to 500° C. with a pressure of 50 to 100 g applied thereto per bump or per wire. As a result, the organic protective film 4 disposed on the electrode 2 is destroyed locally and the ball 28 is crushed by the edge of the capillary 26. Consequently, the ball 28 is bonded with the electrode 2 under pressure. In destroying the protective film 4, the organic protective film 4 may be heated at 150° to 300° C. with ultrasonic energy applied thereto as necessary. After the ball 28 is bonded with the electrode 2 under pressure, the capillary 26 is moved upward to pull the metal wire 27 so as to cut the metal wire 27 from the ball 28. Thus, as shown in FIG. 4, the ball 28 forms a metal bump on the electrode 2.

Figure 5:
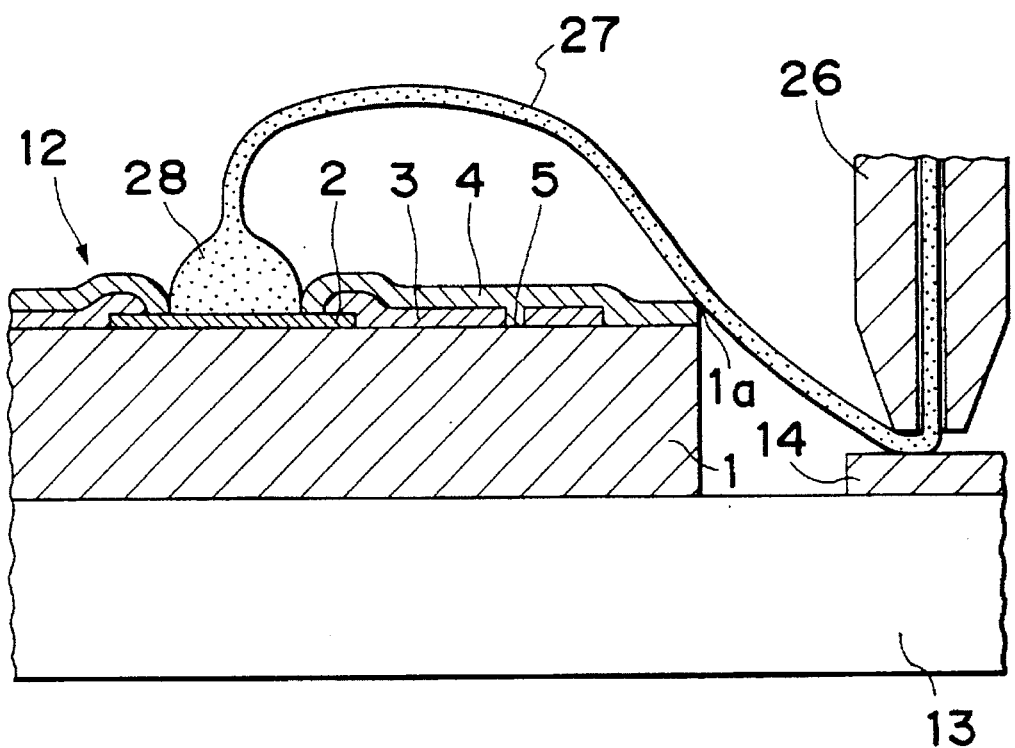
FIG. 5 is a partial sectional view showing connection to such an electronic chip component of an external electrode.

FIG. 5 shows a process of wire-bonding the electronic chip component 12 to a circuit board 13. Referring to FIG. 5, the ball 28 disposed at the leading end of the metal wire 27 destroys the organic protective film 4 and is bonded to the electrode 2 under pressure by a method similar to that shown in FIG. 4. Thereafter, the metal wire 27 is stretched by the movement of the capillary 26 and then is bonded under pressure to a land 14 disposed on the circuit board 13.

Since the mechanical strength of the organic protective film 4 is not sufficient to withstand the pressure applied by the ball 28 of the metal wire 27, it is easy to form the metal bump or bond a metal wire with the electronic chip component 12. The organic protective film 4 is preferable because a portion thereof corresponding to the portion of electrode 2 to he bonded easily can be destroyed, while the remaining surface of the electronic chip component 12 can remain covered by film 4 and the air barrier is maintained. Therefore, the electronic chip component is reliable in that the electrode 2 is maintained protected from and resistant to oxidation and moisture. In addition, even though the bonding wire, namely, the metal wire 27, contacts an edge portion 1a of the electronic chip component 12, the organic protective film 4 prevents the generation of a short circuit due to its electrical insulating properties. Thus, this construction facilitates the formation of the metal bump or the wire bonding, in addition to the electrode being protected from and resistant to moisture and oxidation.

Figure 6:
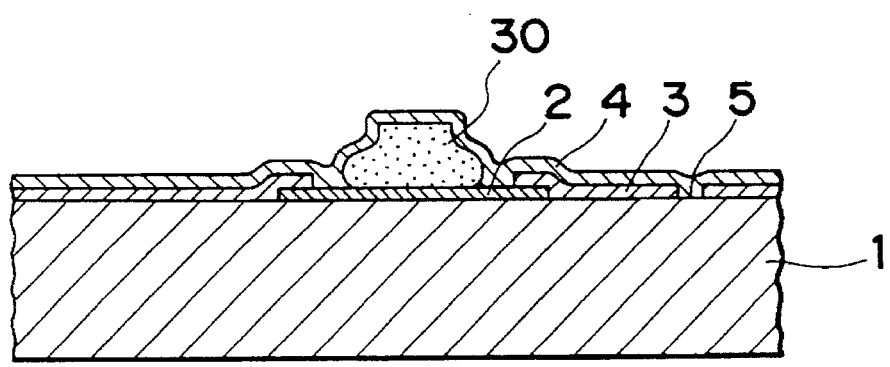
FIG. 6 is a partial sectional view of another embodiment of an electronic chip component according to the present invention.
Figure 7:
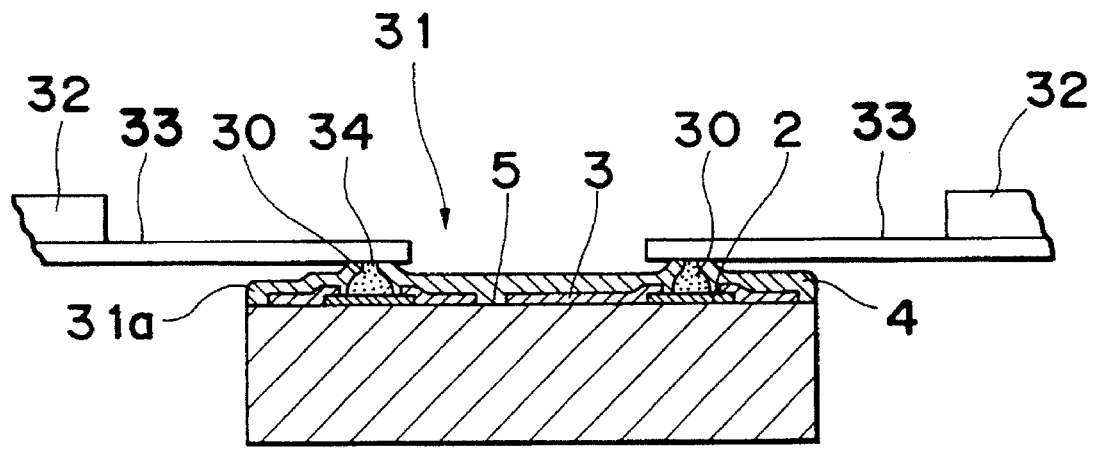
FIG. 7 is a partial sectional view showing connection of the electronic chip component of FIG. 6 to a TAB tape.
Figure 8:
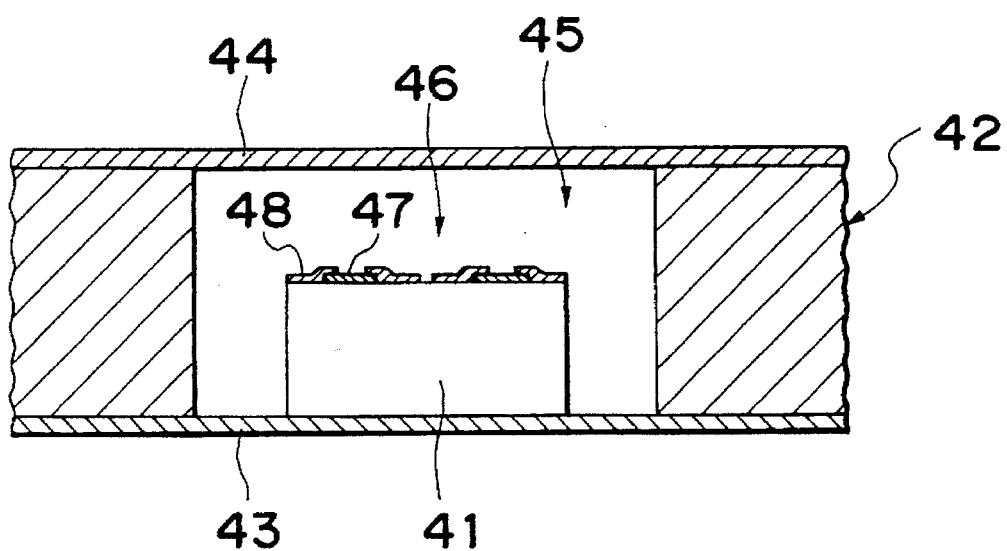
FIG. 8 is a sectional view showing a conventional tape-type package for packing an electronic chip component.

Another embodiment of the present invention is described below with reference to FIG. 6 showing a wafer 1, an electrode 2 and a metal bump 30 disposed on the electrode member 2 for connecting the electrode member 2 with an external electrode. The periphery of the aluminum electrode member 2 in the horizontal direction thereof and an exposed portion of the wafer 1 are covered with a 0.8 to 1.3 μm thick passivation film 3 made of silicon dioxide or silicon tetroxide, so as to protect the wafer 1 from moisture. After the passivation film 3 is formed, polyimide solution is applied to the surface of the wafer 1 in the same thickness by spin coating so as to cover the surface of the metal bump 30, the exposed portion of the electrode 2, and the passivation film 3. Then, the polyimide solution is heated at 100° to 150° C. for one to three hours to harden the polyimide. Thus, the organic protective film 4 is formed. Thereafter, the wafer I is diced into a plurality of electronic chip components 31 (FIG. 7). The polyimide solution flows into the pin hole 5 of the passivation film 3, thus filling the pin hole 5. Thus, the organic protective film 4 covers the entire surface of the electronic chip component 31. Therefore, the surface of the electronic chip component 31 including the electrode 2 and the metal bump 30 is isolated and protected from the air.

Instead of polyimide, depending on the particular electronic chip component, the organic protection film 4 may be made of a thermosetting organic substance or a thermoplastic organic substance such a polyurethane, polyphenylene sulfide or epoxy resin having high electrical insulating properties and applied by a suitable film forming method or under suitable conditions.

FIG. 7 is a sectional view showing the electronic chip component 31 covered with the organic protective film 4 and having the metal bump 30 on the electrode 2 bonded to a TAB tape (Tape-Automatic-Bonding tape) 32. An inner lead 33 of the TAB tape 32 contacts the metal bump 30 formed on the electrode 2 of the electronic chip component 31 through the organic protective film 4. After the inner lead 33 contacts the metal bump 30, a contact portion 34 between the inner lead 33 and the metal bump 30 is heated by pulse current and compressed by means of a bonding tool. The mechanical strength of the organic protective film 4 is not sufficient to withstand the heat and the pressure. Therefore, the portion of the organic protective film 4 covering the contact portion 34 easily can be destroyed. As a result, the metal bump 30 is bonded under pressure with the inner lead 33. Instead of heat and pressure, a pulse method or a constant heating method may be used to bond under pressure the metal bump 30 and the inner lead 33 with each other.

The organic protective film 4 is preferable because it is easy to destroy a portion of the organic protective film 4 necessary for bonding, i.e. the portion at which the inner lead 33 and the metal bump 30 become bonded with each other, while maintaining covered the remaining surface of the electronic chip component 31. Therefore, the electronic chip component according to the third embodiment is reliable in that the electrode 2 is protected from and resistant to oxidation and moisture. In addition, even if the inner lead 33 contacts an edge portion 31a of the electronic chip component 31, the organic protective film 4 prevents the generation of a short circuit due to its electrical insulating properties.

Instead of the TAB tape, a flip chip may be mounted on a normal circuit board.

Although the present invention has been fully described in connection with preferred embodiments thereof with reference to the accompanying drawings, it is to be noted that various changes and modifications will be apparent to those skilled in the art. Such changes and modifications are to be understood as being included within the scope of the present invention as defined by the appended claims unless they depart therefrom.

What is claimed is:

1. An electronic chip component comprising:

a wafer having an active surface;

an electrode formed on a portion of said active surface;

a passivation film covering a portion of said active surface not covered by said electrode and a portion of said electrode, with another portion of said electrode not being covered by said passivation film, said passivation film comprising silicon dioxide or silicon nitride and forming a moisture barrier to said portion of said wafer; and an organic protective film covering entirely and providing an air barrier for said another portion of said electrode and said passivation film, said organic protective film having an outer surface that is entirely exposed and uncovered, and said organic protective film being formed of material capable of, during a subsequent operation of pressing an external electrode against said organic protective film to bond such external electrode electrically and mechanically to said electrode, being destroyed by such pressure locally only in an area thereof in contact with the external electrode, while not being destroyed in any other area thereof and thereby maintaining said air barrier.

2. An electronic chip component as claimed in claim 1, wherein said electrode comprises a flat electrode member formed on said active surface and a metal bump connected to said electrode member, and said organic protective film covers said metal bump.

3. A packaged electronic chip component assembly comprising:

a carrier tape main body having therethrough a hole defining an electronic chip component assembly storage space having opposite ends opening onto opposite surfaces of said carrier tape main body;

an electronic chip component including a wafer having an active surface, an electrode formed on a portion of said active surface, a passivation film covering a portion of said active surface not covered by said electrode and a portion of said electrode, with another portion of said electrode not being covered by said passivation film, said passivation film comprising silicon dioxide or silicon nitride and forming a moisture barrier to said portion of said wafer, and an organic protective film covering entirely and providing an air barrier for said another portion of said electrode and said passivation film, said organic protective film having an outer surface that is entirely exposed and uncovered, and said organic protective film being formed of material capable of, during a subsequent operation of pressing an external electrode against said organic protective film to bond such external electrode electrically and mechanically to said electrode, being destroyed by such pressure locally only in an area thereof in contact with the external electrode, while not being destroyed in any other area thereof and thereby maintaining said air barrier;

said electronic chip component being positioned within said space in said carrier tape main body and being retained therein by first and second cover tapes respectively applied to first and second said opposite surfaces and covering respective first and second said opposite ends of said space; and said organic protective film defining means to protect said active surface from being damaged or chipped by movement of said electronic chip component within said space.

4. An assembly as claimed in claim 3, wherein said electrode comprises a flat electrode member formed on said active surface and a metal bump connected to said electrode member, and said organic protective film covers said metal bump.

* * * * *